(12) United States Patent
Schoofs et al.

(10) Patent No.: US 6,420,851 B1
(45) Date of Patent: Jul. 16, 2002

(54) METHOD OF AND DEVICE FOR DETERMINING THE CHARGE CONDITION OF A BATTERY

(75) Inventors: Franciscus A. C. M. Schoofs; Wanda S. Kruijt; Robert E. F. Einerhand; Saskia A. C. Hanneman; Hendrik J. Bergveld, all of Eindhoven (NL)

(73) Assignee: Koninklijke Philips Electronics N.V. (NL)

( * ) Notice: Subject to any disclaimer, the term of this patent is extended or adjusted under 35 U.S.C. 154(b) by 0 days.

(21) Appl. No.: 09/542,710

(22) Filed: Apr. 4, 2000

(30) Foreign Application Priority Data

Apr. 8, 1999 (EP) .............................................. 99201102

(51) Int. Cl.$^7$ ................................................. H02J 7/00
(52) U.S. Cl. ...................................... 320/132; 320/130
(58) Field of Search ................................ 320/132, 130, 320/116, 106; 324/636, 433, 429, 40

(56) References Cited

U.S. PATENT DOCUMENTS

| | | | | |
|---|---|---|---|---|
| 5,023,153 A | * | 6/1991 | Weppner ...................... 429/40 |
| 5,629,600 A | * | 5/1997 | Hara ........................... 320/132 |
| 5,861,732 A | * | 1/1999 | Takimoto et al. ........... 320/132 |
| 5,994,877 A | * | 11/1999 | Seri et al. .................... 320/132 |
| 6,242,891 B1 | * | 6/2001 | Parsonage ................... 320/132 |

* cited by examiner

*Primary Examiner*—Gregory Toatley
*Assistant Examiner*—Lawrence Luk
(74) *Attorney, Agent, or Firm*—Dicran Halajian

(57) ABSTRACT

A method is described for determining the charge condition of a battery (1), wherein the electromotive force ($V_{EMF}$) is derived from measurements of the terminal voltage in a loaded condition, and the charge condition (Q) is determined with the aid of a pre-calculated relationship between ($V_{EMF}$) and the charge condition (Q) on the basis of the ($V_{EMF}$) thus calculated.

12 Claims, 3 Drawing Sheets

METHOD OF AND DEVICE FOR DETERMINING THE CHARGE CONDITION OF A BATTERY

BACKGROUND OF THE INVENTION

The present invention in general relates to the determination of the charge condition of a battery on the basis of the terminal voltage of said battery, particularly a rechargeable battery.

The present invention more particularly, though not exclusively, relates to Li-ion batteries, and the invention will be explained specifically for this example of use. However, it is emphasized that the present invention likewise relates to other battery types.

Nowadays many electrical apparatuses are powered by means of a battery. During operation of such an apparatus the battery is gradually discharged until it is finally empty. For many apparatuses it is desirable that the user is given an indication of the instantaneous charge condition of the battery in order not be unexpectedly confronted with an empty battery, as a result of which the apparatus ceases to function. Some important examples of apparatuses for which this is very desirable are video cameras, laptop computers and mobile telephones. It is usually adequate to have a coarse indication of the charge condition of the battery, for example in three or four gradations. However, in some cases it is desirable to have an accurate read-out of the charge condition, for example in per cent of the maximum charge or in residual playing time expressed in minutes or even seconds. Although the present invention will be elucidated specifically for the case of a mobile telephone, the same issue holds for other uses, so that the use of the invention has a broader scope.

It is to be noted that herein the term "charge condition" in general is to be understood to means the amount of charge or energy present in the relevant battery. This charge or energy can be expressed in absolute terms or in relative terms as a fraction of the maximum. In this case 0% corresponds to an empty battery and 100% corresponds to a fully charged battery. However, it will be evident to one skilled in the art that it is alternatively possible to define the charge condition of a battery as the extent to which this battery has been drained, in which case 0% corresponds to a fully charged battery and 100% corresponds to an empty battery.

Various methods of determining the charge condition of a battery are known, which are based on the fact that the terminal voltage of most battery types depends on the charge condition. The terminal voltage decreases as the battery is drained further. Thus, in the known measurement methods the terminal voltage of the battery is always measured and an indication of the charge condition is derived from the measured terminal voltage.

However, in practice this measurement principle gives rise to some problems.

First of all, the terminal voltage depends not exclusively on the charge condition but also on other factors such as the temperature of the battery and the age of the battery, or the number of charging/discharging cycles the battery has undergone. When the battery is in use the terminal voltage also depends on the magnitude of the current supplied by the battery, which means that the impedance of the load and the internal impedance of the battery play a part. In order to eliminate the last-mentioned factors it is therefore better to measure the terminal voltage of the battery in the no-load condition but this is not always possible. Moreover, it takes some time after disconnection the load before the terminal voltage of the battery has reached a stable value (relaxation).

A further problem in this context is that a rechargeable battery for an apparatus such a s mobile telephone is accommodated in a battery pack whose contact faces correspond to contact faces of the application apparatus. As a rule, components such as a safety switch are arranged between the battery terminals and the contact faces of the battery pack, as a result of which a voltage loss occurs in this path. Furthermore, a contact resistance occurs between the battery pack and the apparatus, which gives rise to a voltage loss whose magnitude is unknown, is not constant in time, depends on unknown and variable factors such soiling of the contact faces, etc. Al this means that in practice it is not readily possible to measure the actual terminal voltage of the battery in the application apparatus.

SUMMARY OF THE INVENTION

Therefore, it is an objects of the present invention to provide a method of determining the charge condition of a battery, which mitigates or eliminates the aforementioned problems. More in particular, it is an object of the present invention to provide a method of determining the charge condition of a battery, which can be used in a loaded condition of a battery and which is largely independent of extraneous conditions.

The invention is based on the recognition of the fact that there is a relationship between the charge condition of a battery and the electromotive force of this battery, hereinafter also referred to as $V_{EMF}$, which relationship is independent of extraneous conditions to a satisfactory extent.

According to the present invention, on the basis of this recognition, a method of determining the charge condition of a battery is characterized in that the $V_{EMF}$ of the battery is determined and the charge condition is determined from the measured $V_{EMF}$ on the basis of said relationship.

A further aspect of the present invention is based on the recognition of the fact that the characteristic of $V_{EMF}$ versus the charge of a battery, at least for an Li-ion battery, has a number of stages with fairly sharp transitions between these stages, and that the positions of these stages is hardly or not dependent on variations in ambient factors. Thus, these transitions may be regarded as calibration points. On the basis of the recognition of this fact, according to the invention, a method of determining the charge condition of a battery is preferably characterized in that $dV_{EMF}/dQ$ is measured at regular intervals during charging and discharging, respectively, and the charge condition is determined also on the basis of the result of this measurement.

BRIEF DESCRIPTION OF THE DRAWINGS

These and other aspects, features and advantages of the present invention will be elucidated further in the following description of embodiments of the invention with reference to the drawings, in which.

DESCRIPTION OF THE PREFERRED EMBODIMENTS

Figure 1:
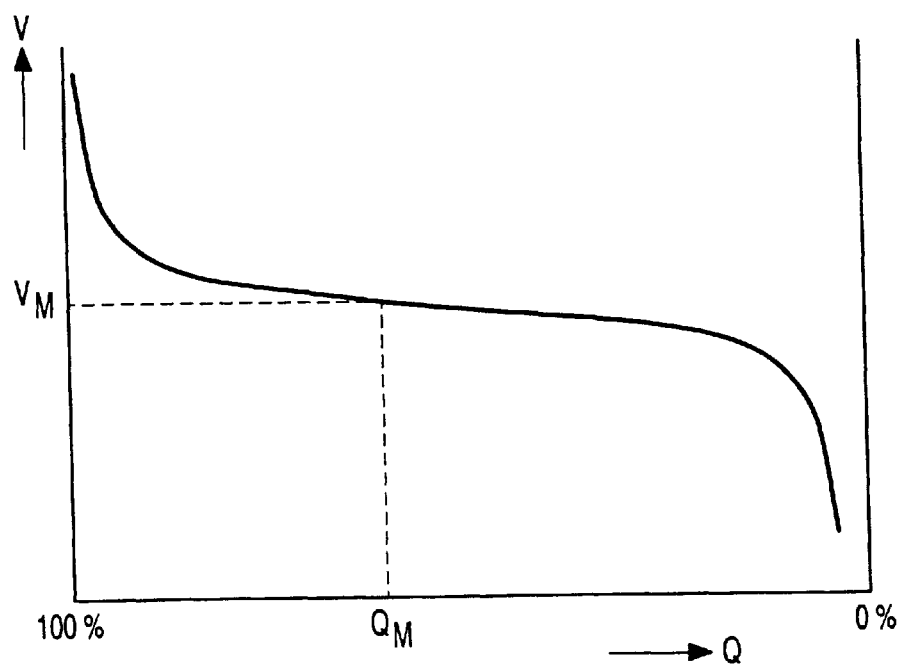
FIG. 1 shows a graph which represents the voltage of a battery as a function of the charge condition.

FIG. 1 illustrates the voltage characteristic of a battery in a general sense, the terminal voltage V of the battery being plotted in arbitrary units along the vertical axis and the charge Q in the battery being plotted in per cent of a maximum along the horizontal axis, which represents the charge condition of the battery. The characteristic ranges from completely full (at the left in the Figure) to empty (at the right in the Figure), which is indicated in the Figure by 100% and 0%, respectively. It is to be noted that, in practice, a battery is already considered to be empty if its terminal voltage decreases below a predetermined voltage value, in which case the instantaneous charge is still greater than 0%. The terminal voltage of a fully charged Li-ion cell, for example, is 4.1 V and this cell is considered to be empty when the terminal voltage has decreased to 3.0 V.

The voltage characteristic of a battery as shown in FIG. 1 is a continuously falling function having a comparatively flat central stage. The exact shape of the characteristic depends on the battery type. It will be evident that, in principle, it is possible to determine the instantaneous charge condition, referred to as $Q_M$ by measuring the instantaneous terminal voltage, referred to as $V_M$, if the voltage characteristic of the relevant battery is known.

In general, the instantaneous terminal voltage can be determined fairly accurately, although its measurement may already pose a problem on the case of a battery pack, as explained hereinbefore. However, as already stated hereinbefore, the battery characteristic is dependent on extraneous conditions such as temperature and load. It will be evident from FIG. 1 that even a slight vertical shift of the characteristic terminal voltage curve results in a comparatively large change of the instantaneous charge condition to be derived therefrom. In known measurement methods it is therefore necessary to have various terminal voltage curves with the temperature as parameter and it is further necessary to measure the instantaneous temperature in order to determine which curve is valid. Moreover, the known methods require a correction for changes in the load condition and for changes in the internal impedance of the battery.

Moreover, as already stated hereinbefore, the problems caused by the battery load can be solved basically by measuring the no-load terminal voltage or open-circuit voltage (also referred to as $V_{OCV}$) of the battery. However, this is not always possible because this means, for example, that the relevant apparatus such as a mobile telephone or a laptop computer must be turned off. On the other hand, it takes a comparatively long time before the open-circuit voltage $V_{OCV}$ of a battery has settled at a stable value.

In accordance with the insight underlying the present invention said problems do not occur or are at least mitigated to a large extent when as voltage parameter the electromotive force of the battery is taken, which bears the reference $V_{EMF}$. The characteristic of $V_{OCV}$ versus relative charge condition has a shape comparable to that in FIG. 1 but proves to be independent of parameters such as temperature, age and load to a satisfactory extent. This implies that two data are important for determining the charge condition of a battery. First of all, said characteristic of $V_{OCV}$ versus relative charge condition of the relevant battery must be known. This may be compared to the necessity of knowing characteristic of the terminal voltage versus charge condition in the prior art but there are some important differences: a first difference is that it is not the terminal voltage but the $V_{EMF}$ which is detected, a second difference being that only a single characteristic is necessary, regardless of ambient factors.

In the second place, the $V_{EMF}$ of the relevant battery should be measured each time that it is required to know the $V_{EMF}$ versus charge condition characteristic.

Hereinafter, the behavior of a battery will be explained in more detail and it will be clarified how the $V_{EMF}$ can be determined by measuring the terminal voltage in the loaded condition, referred to as $V_{CCV}$. It will be evident to one skilled in the art how the $V_{EMF}$ versus charge condition characteristic can then be measured and stored in a memory, for which reason this will not be described any further.

Figure 2:
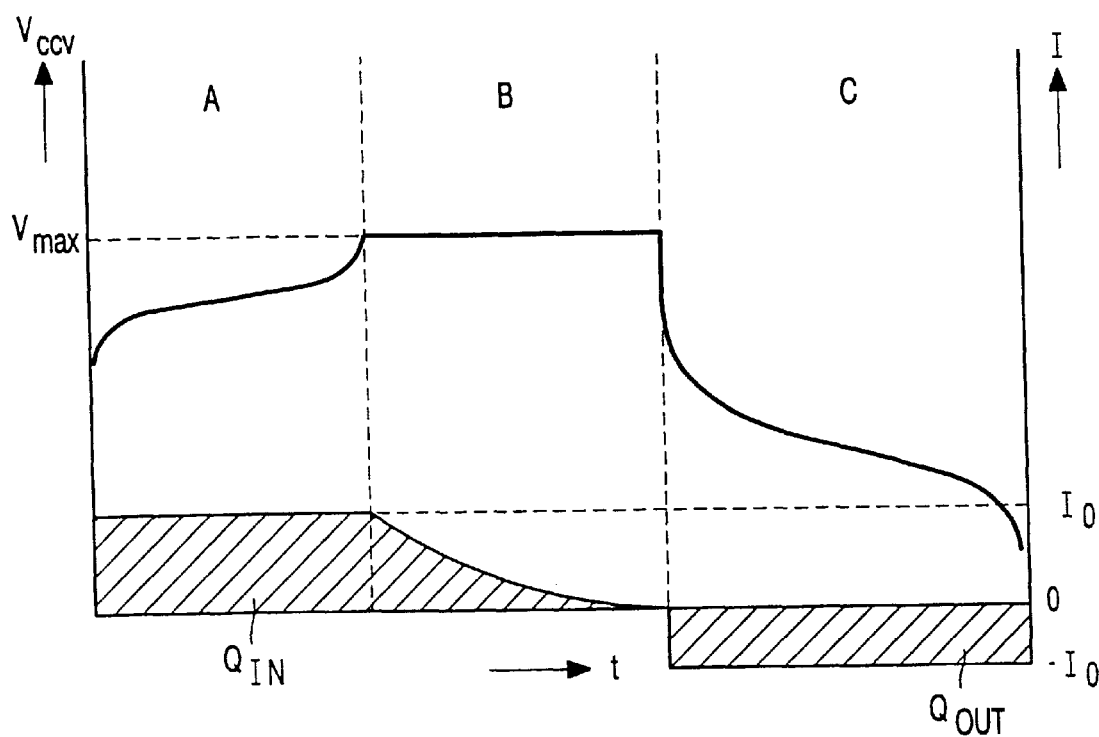
FIG. 2 shows a graph which represents the battery voltage as a function of time during a charging/discharging cycle.

FIG. 2 shows typical curves which illustrate the characteristic of a Li-ion battery, respectively during charging and discharging in a CCCV mode (constant current, constant voltage). The terminal voltage $V_{CCV}$ of the battery in the loaded condition is plotted along the left-hand vertical axis and the time is plotted along the horizontal axis. The current I through the battery is plotted along the vertical axis: a positive value indicates charging of the battery and a negative value indicates the supply of current by the battery. The upper curve represents $V_{CCV}$. The lower curve illustrates the current I. The cycle is started at the left in FIG. 2 and it is assumed that the battery is empty. In the graph of FIG. 2, three stages A, B and C can be distinguished. In the first stage A the battery is charged with a constant current strength $I_0$. The terminal voltage $V_{CCV}$ of the battery in this stage A rises to a predetermined maximum value $V_{MAX}$. As charging of the battery proceeds in the second stage B the terminal voltage $V_{CCV}$ is maintained constant at said maximum value $V_{MAX}$ and the charging current I gradually decreases to a small value which, in practice, is 10% of $I_0$ or even less. At this instant the battery is regarded as fully charged (100%).

It is to be noted that this does not mean that no more charge can be stored in the battery. If the terminal voltage is set to a higher value this will again produce a charging current. However, this is detrimental to the battery. In practice, there is a maximum value $V_{MAX}$ specified by the manufacturer and the battery is considered to be fully charged if it has been charged in accordance with the instructions described above.

It will be evident to one skilled in the art that the integral of the current strength with respect to time, represented in FIG. 2 by the area below the current curve, is a measure of the applied amount of charge $Q_{IN}$.

In the third stage C the battery is loaded to deliver a current $-I_0$ which is equal but directed oppositely to the current $I_0$ with which it has been charged. As time expires, the terminal voltage $V_{VCC}$ decreases. It will be evident to one skilled in the art that the integral of the current strength with respect to time, represented in FIG. 2 by the area below the current curve, is now a measure of the amount of charge $Q_{OUT}$ supplied by the battery. In practice, the stage C ceases before the battery has been drained completely, i.e. once the terminal voltage of the battery has become impermissibly low.

Figure 3:
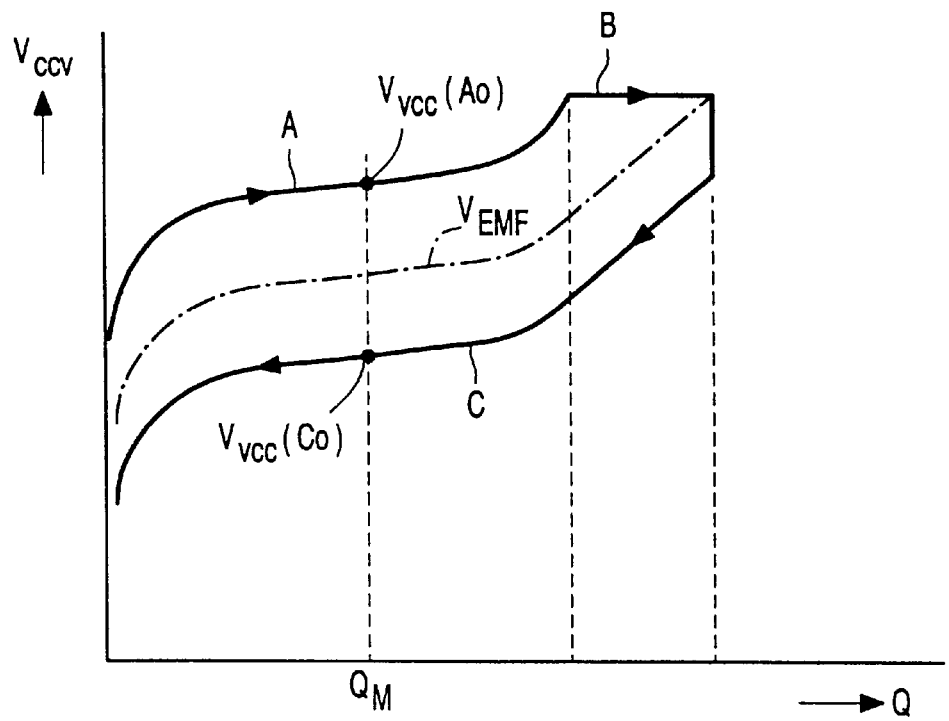
FIG. 3 shows a graph which represents the battery voltage as a function of the charge during a charging/discharging cycle.

FIG. 3 shows the characteristic of FIG. 2 in a different representation.

Again, the terminal voltage $V_{CCV}$ of the battery in the loaded condition is plotted along the vertical axis but the amount of charge present in the battery is plotted along the horizontal axis. Arrows indicate in which direction the battery cycles through the characteristic of FIG. 3. The stages A, B and C correspond to those in FIG. 2.

FIG. 3 further shows the electromotive force $V_{EMF}$ of the battery as a broken line. $V_{EMF}$ is equal to $V_{CCV}$ at the end of the stage B, where the current has decreased to 0, i.e. where the battery charge is 100%. For the values of Q belonging to the stage A the curve of $V_{EMF}$ is situated exactly between the curves A and C.

Thus, for one specific instantaneous charge condition $Q_M$ and one specific current strength $I_0$ through the battery the terminal voltage $V_{CCV}$ can assume two different values $V_{CCV}(A_0)$ and $V_{CCV}(C_0)$, depending on whether the battery is charged (stage A) or is loaded (stage C). These two values are given in FIG. 3. These two values are also given in FIG. 4, where the terminal voltage $V_{CCV}$ in the loaded condition is plotted versus the current strength I. The point $V_{CCV}(C_0)$ corresponds to a negative value of the current strength.

Figure 4:
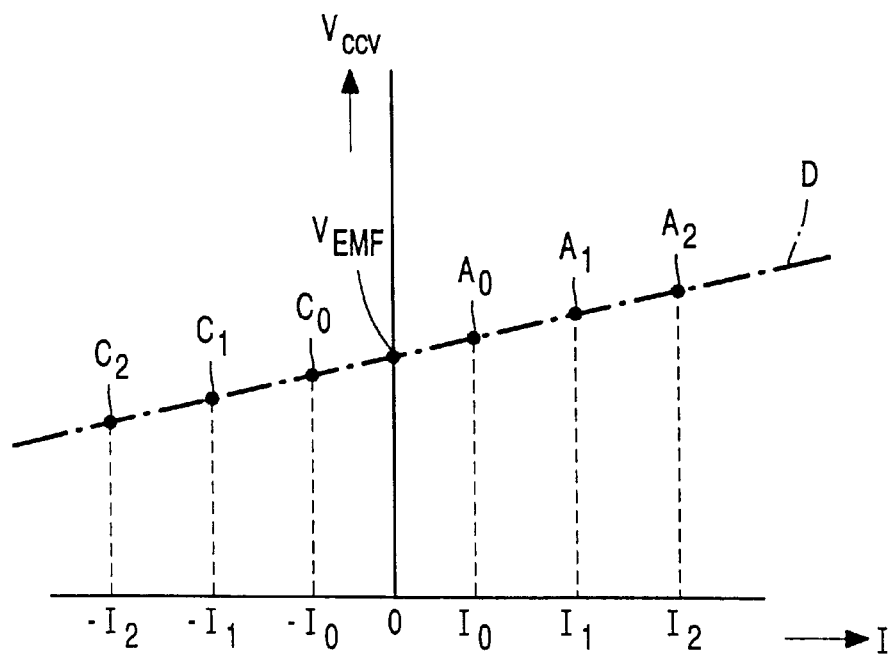
FIG. 4 shows a graph in which the terminal voltage of a battery is plotted versus the current strength.

The charging/discharging characteristic of FIG. 3 relates to one given current strength for charging ($I_0$) and discharging ($-I_0$), respectively. For other values of the current strength the curves A and C look similar but their vertical spacing varies: the spacing increases as the current strength I increases. More specifically, the curve A is raised and the curve C is lowered as this current strength I increases. This means that for the same charge condition $Q_M$, if another current strength $I_1$, higher than $I_p$ is chosen, the terminal voltage $V_{CCV}$ will assume a higher value $V_{CCV}(A_1)$ or a lower value $V_{CCV}(C_1)$, respectively. In FIG. 4 this is illustrated for different current strengths $I_1$ and $I_2$.

The collection of all these points defines a characteristic curve bearing the reference letter D in FIG. 4. The electromotive force $V_{EMF}$ of the battery is the point of intersection of this curve D with the vertical axis, i.e. the line I=0. In practice, this curve D proves to be linear in close approximation and symmetrical with respect to said point of intersection.

It is to be noted that the difference between, respectively, $V_{CCV}(A_i)$ or $V_{CCV}(C_i)$ and $V_{EMF}$ depends inter alia on the internal impedances of the battery, the impedances in the battery pack, the contact resistances at the contact faces etc. In practice, said difference may fluctuate in time, even in the case of a constant current strength. However, this does not affect the determination of $V_{EMF}$, as will be apparent from the following.

The present invention provides three different methods which are possible for determining $V_{EMF}$ by measuring the terminal voltage of a loaded battery (pack). These methods are as follows:

1a) extrapolation during charging;
1b) extrapolation during discharging;
2) interpolation during alternate charging/discharging.

1a) Extrapolation During Charging

During charging of the battery the current strength I is briefly set to different values $I_i$ and the value $V_{CCV}(A_i)$ which then occurs is measured. Since the measurement takes a comparatively short time the measurement data may be considered to relate to the same charge condition of the battery. Said measurement data enable at least a part of said relationship between $V_{CCV}$ and I to be reconstructed (the right-hand half of the curve D). $V_{EMF}$ is then obtained by extrapolation of said measurement data to I=0. This is simplest when the curve D is a linear relationship as in the case of Li-ion batteries: in that case it suffices to measure at two measurement points $A_1$ and $A_2$ on the curve D, as will be evident to one skilled in the art. It is then not necessary to know the exact values $I_1$ and $I_2$ of the current strength: it suffices if their ratio to one another is known. Preferably, $I_2$ is selected to be twice as large as $I_2$ because $I_2$ can then be derived simply from $I_1$ by means of current doubling.

If the curve D of a given battery type is non-linear the curve D can be approximated by means of a polynomial, for example a second or third-degree polynomial, which requires a plurality of measurement points in order to fit the coefficients of this polynomial, as will be evident to one skilled in the art.

1b) Extrapolation During Discharging

In a manner similar to that described under (1a) the current strength I is briefly set to different values $I_i$ during discharging of the battery and the value $V_{CCV}(C_i)$ which then occurs is measured. Since the measurement takes a comparatively short time the measurement data may be considered to relate to the same charge condition of the battery. Said measurement data enable at least a part of said relationship between $V_{CCV}$ and I to be reconstructed (the left-hand half of the curve D). Again $V_{EMF}$ is now obtained by extrapolation of said measurement data to I=0. This is simplest when the curve D is a linear relationship as in the case of Li-ion batteries: in that case it suffices to measure at two measurement points $C_1$ and $C_2$ on the curve D. Also in this case it suffices if the ratio of the current strengths to one another is known.

Also in this case it holds that if the curve D of a given battery type is non-linear the curve D can be approximated by means of a polynomial, for example a second or third degree polynomial, which requires a plurality of measurement points in order to fit the coefficients of this polynomial, as will be evident to one skilled in the art.

2) Interpolation During Alternate Charging and Discharging

The battery is discharged with a given current strength $I_0$ during a comparatively short time (of the order of magnitude of, for example, one minute) and is subsequently charged with the same current strength $I_0$ for the same length of time, or the other way round. The terminal voltages $V_{CCV}(C_0)$ and $V_{CCV}(A_0)$ which occur in both cases are measured. The corresponding value $V_{EMF}$ can then be obtained simply by averaging the two measured terminal voltages $V_{CCV}(C_0)$ and $V_{CCV}(A_0)$. In principle, this method can provide a slightly higher accuracy than the extrapolation methods described hereinbefore and is also satisfactory if the curve D is non-linear.

In all the three aforementioned methods it is not necessary to known the exact current strength. It is adequate to know the relative ratios between the current strengths. However, in the interpolation method (2) it is preferable that the current strength during charging is equal to the current strength during discharging because this cancels the role of possible non-linear effects and enables the formula for calculating $V_{EMF}$ to be as simple as possible.

Figure 5:
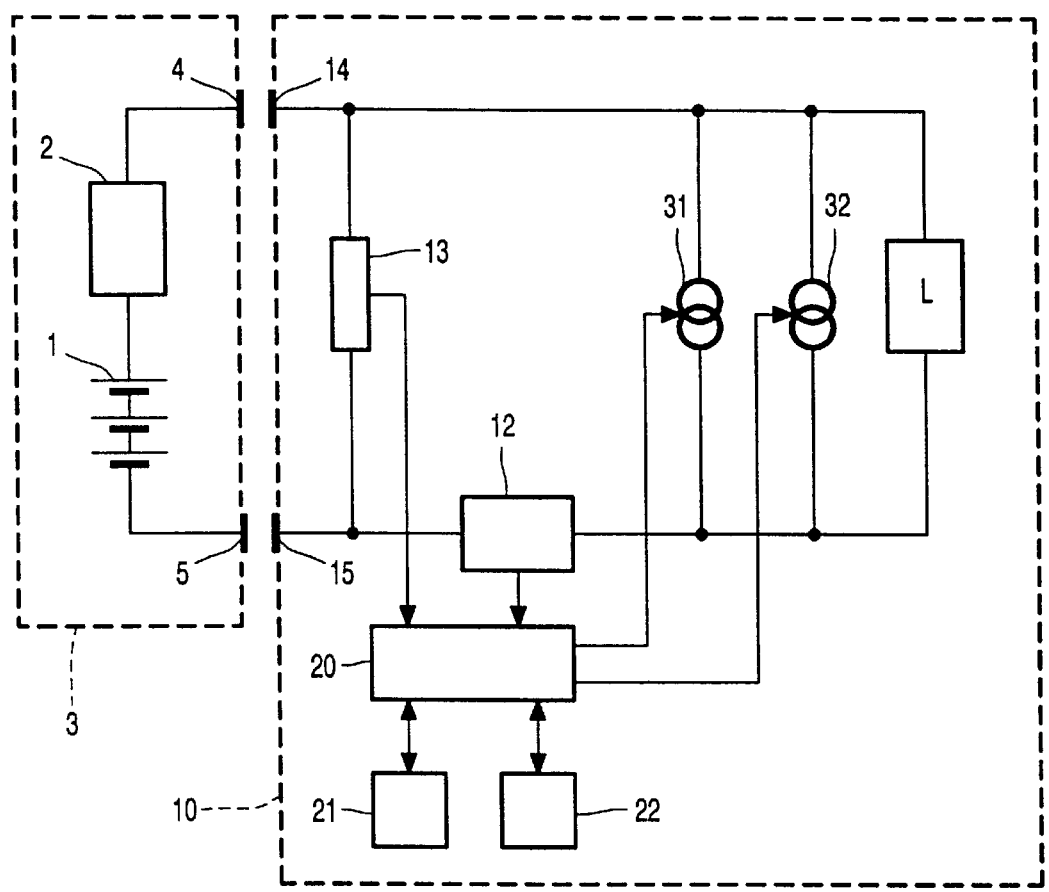
FIG. 5 shows a circuit diagram of a battery pack and an application apparatus.

FIG. 5 schematically shows a circuit diagram of a battery 1 included in a battery pack 3 having contact faces 4 and 5. The internal impedance of the battery 2 and the impedances between the battery 2 and the contact faces 4, 5 are represented together as the series impedance 2.

An application apparatus, such as a laptop computer or mobile telephone, as a whole bears the reference numeral 10. The electrical circuit of the apparatus 10, which circuit as a whole is represented schematically as a load L, is powered by means of the battery pack 3. The apparatus 10 has a housing which is mechanically adapted to receive and hold the battery pack 3, as is generally known and is not shown, and further has contact faces 14 and 15 corresponding to the contact faces 4, 5 of the battery pack 3. For the sake of simplicity the contact resistance between the contact faces 14, 15 of the apparatus, on the one hand, and the contact faces 4, 5 of the battery pack, on the other hand, are assumed to form part of the impedance 2 in the present description.

For the implementation of the present invention a data processing and control unit 20 (hereinafter briefly referred to as control means) has been provided, for example in the form of a suitably programmed nicroprocessor, microcontroller or the like. Associated with the control means 20 is a memory 21 which stores a relationship between the electromotive force $V_{EMF}$ of the battery 1 and the charge condition of this battery. This relationship may be stored in the form of a table, a formula or coefficients of a function such as a polynomial, as will be evident to one skilled in the art. A current meter 12 is arranged in series with the load L and supplies a current measurement signal to the control means 20, which signal is representative of the strength of the current which flows through the battery 1. A voltage meter 13 is arranged between the contact faces 14, 15 of the apparatus 10 and supplies a voltage measurement signal to the control means 20, which signal is representative of the voltage across said contact faces.

The apparatus 10 further includes a first controllable current source 31, which is connected to the contact faces 14, 15 of the apparatus 10 and which is controlled by the control means 20. It will be obvious to one skilled in the art that the charging circuit may alternatively include a controllable voltage source. The first controllable current source 31 (or voltage source) is a current-supplying current source which serves to charge the battery 1. A power supply circuit for the first controllable current source 31 is not shown in the Figure but can be a standard power supply circuit for connection to a power mains, as will be evident to one skilled in the art.

The apparatus 10 further includes a second controllable current source 32, which is connected in parallel with the load L and which is controlled by the control means 20. The second controllable current source 32 is a dissipating current source which serves to drain the current from the battery 1 and thereby load the battery with a discharging current. As an alternative for a dissipating current source it is possible to use a series arrangement of a passive impedance (for example a resistor) and a switch which is controllable by the control means 20.

The Figure also shows that the apparatus 10 has a display 22 for displaying a charge condition indication signal. In the case of, for example a laptop computer or a mobile telephone this display may form part of the regular display of the apparatus 10, but it is likewise possible to provide a separate display. The charge condition indication signal is displayed on the display by the control means 20 in a manner which is evident to one skilled in the art and which is therefore not explained any further.

Operation During Normal Use

During normal use the load L is energized from the battery pack 3. The current then supplied by the battery pack 3 is measured by the control means 20 with the aid of the current sensor 12, while the input voltage across the contact faces 14, 15 is measured by the control means 20 with the aid of the voltage meter 13. The control means 20 is adapted to increment the strength of the current supplied by the battery pack 3 at regular intervals and to measure the resulting input voltage across the contact faces 14, 15. For this purpose, the control means 20 controls the dissipating current source 32 in such a manner that it drains additional current from the battery pack 3. This does not affect the load L.

The control means 20 is further adapted to calculate the $V_{EMF}$ from the measurement data by extrapolation, as described hereinbefore under (1b) "Extrapolation during discharging". Subsequently, the charge condition of the battery 1 of the battery pack 3 is determined on the basis of the relationship in the memory 21 and the calculated $V_{EMF}$, which charge condition can be displayed on the display 22.

In accordance with the present invention said relationship is independent of ambient factors to a satisfactory extent, as a result of which the charge condition thus calculated is very reliable and accurate, without the necessity of a correction for ambient factors such as temperature.

Operation in a Charging Mode

The control means 20 is adapted to control the first current source 31 so as to supply a charging current when a charging circuit of the apparatus 10 is connected to a power supply such as the power mains, the magnitude of the charging current being controlled as a function of time in accordance with a predetermined pattern. The current then consumed by the battery pack 3 is measured by the control means 20 with the aid of the current sensor 12, while the input voltage across the contact faces 14, 15 is measured by the control means 20 with the aid of the voltage meter 13. In accordance with the present invention the control means 20 is further adapted to set the charging current strength at regular intervals briefly to a value which deviates from said pattern and to store the input voltage which then occurs.

In a first variant it is possible for the control means 20 to control the first controllable current source 31 so as to supply briefly either a higher or a lower charging current strength. The control means 20 can then calculate the $V_{EMF}$ from the measurement data by extrapolation, as described hereinbefore under (1a) "Extrapolation during charging" and can subsequently determine the charge condition of the battery 1 of the battery pack 3 on the basis of the relationship in the memory 21 and the calculated $V_{EMF}$, which charge condition can be displayed on the display 22.

In a second variant it is possible for the control means 20 to briefly reverse the direction of the current through the battery 1. For this purpose, the control means 20 is adapted to first turn off the first current source 31 and, if applicable, to turn on the second current source 32, thereby causing the battery 1 to supply current for the load L and, if applicable, for the dissipating current source 32. The control means 20 can then calculate the $V_{EMF}$ from the measurement data by interpolation, as described hereinbefore under (2) "Interpolation during alternate charging/discharging" and can subsequently determine the charge condition of the battery 1 of the battery pack 3 on the basis of the relationship in the memory 21 and the calculated $V_{EMF}$, which charge condition can be displayed on the display 22.

In the foregoing it has been described that variations in a charging current for the battery 1 can be produced by means of the first controllable current source 31 and that variations in a discharging current for the battery 1 can be produced by means of the second controllable current source 32, while alternate charging and discharging can be achieved by turning the first controllable current source 31 alternately on or off, while the second controllable current source 32 can then be turned off and turned on, respectively. As an alternative, these two current sources 31, 32 may be replaced by a single controllable bi-directional current source, of which not only the current strength can be controlled but which can also be set to a current supplying or a current draining mode, as required. In a manner similar to that mentioned hereinbefore in relation to the first current source 31, such a bi-directional current source would then be connected to a power supply circuit to receive power in a current supplying mode.

FIG. 5 shows that the control means 20 and the associated memory 21 are physically included in the application apparatus 10. However, this is not necessary. As an alternative, one or more of these parts may be accommodated within the battery pack 3. Particularly preferred is an embodiment in which the memory 21 is physically included within the battery pack 3 or where the battery pack 3 has a means which is representative of a given type of battery pack and which can be identified by the control means 20. An example of such an identification means is an identification resistor. Such a preferred embodiment should then be provided with a communication path between the battery pack 3 and the application apparatus 10. For this purpose, the battery pack 3 may be provided with an information connector face which corresponds to an information connector face of the application apparatus, the memory 21 being connected to the information connector face of the battery pack 3 and the control means 20 being connected to the information connector face of the application apparatus. However, for the sake of simplicity this is not shown in the Figure.

If the memory 21 is situated inside the battery pack 3 this has the major advantage that a characteristic which applies to the relevant battery needs to be measured only once and subsequently remains associated with the battery, which is particularly useful if the battery pack is changed at regular intervals. It is alternatively possible to store a plurality of relationships of a plurality of battery packs in a memory in the application apparatus, the control means 20 then being adapted to address the correct relationship on the basis of information which is associated with the battery pack and which is readable by the control means.

In the foregoing it has been described how a reliable indication of the charge condition can be obtained starting from a known relationship between $V_{EMF}$ and this charge condition. If this relationship is not yet known, for example because a certain battery pack is used for the first time in a given application apparatus, it is in principle not possible to determine the charge condition by measuring $V_{EMF}$ but it is necessary to first carry out a complete calibration cycle. For this purpose, the control means 20 may be adapted to charge the battery, which is assumed to be fully discharged, and to store how much charge is transferred to the battery (integral of current with respect to time). This is referred to as the "bookkeeping method". In the manner described hereinbefore $V_{EMF}$ is calculated at regular intervals, the measured $V_{EMF}$ in relation to the overall energy transferred to the battery then being stored in the memory 21.

Figure 6:
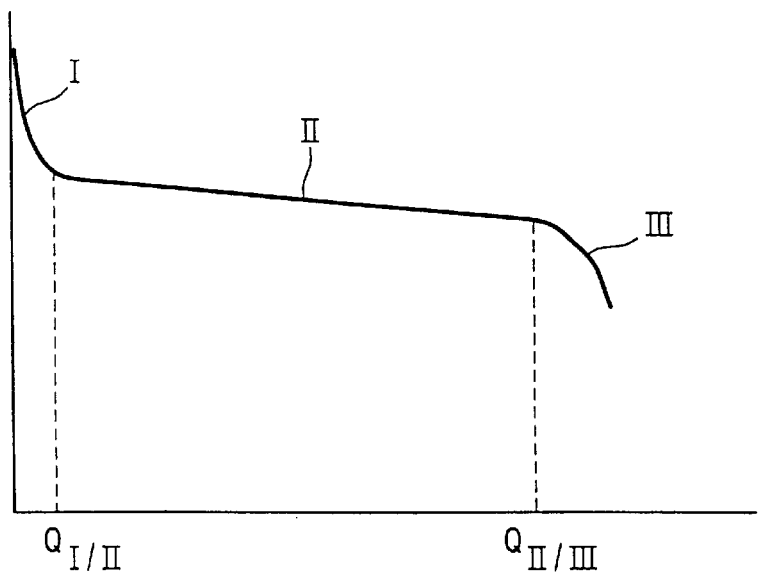
FIG. 6 shows a graph, comparable to that of FIG. 1, which shows a graph which represents the characteristic of a Li-ion battery.

In the case that the memory 21 does not (yet) have any information or any reliable information it is yet desirable to obtain at least a "coarse" indication of the charge condition of the battery, where "coarse" is to be understood to mean that it is adequate to make a distinction between full, half-full and nearly empty. In accordance with the invention it is possible to obtain such a coarse indication on the basis of a few readily identifiable features of the voltage characteristic of a battery, as illustrated in FIG. 1. FIG. 6 shows a characteristic of a Li-ion battery similar to that shown in FIG. 1. This $V_{EMF}$ versus charge characteristic has, at least for a Li-ion battery, a first range I with a fairly steep slope, a second range II with a fairly moderate slope, and a third range III with again a fairly steep slope. The transitions between adjacent ranges, whose X coordinates are marked $Q_{I/II}$ and $Q_{II/III}$ in FIG. 6, are fairly sharp. In accordance with an important insight of the present invention it appears that $Q_{I/II}$ and $Q_{II/III}$ are hardly or not dependent on changes in ambient factors. These transitions may therefore be regarded as calibration points.

This can be utilized by measuring $dV_{EMF}/dQ$ at regular intervals during charging or discharging and comparing the measurement value with a predetermined reference value. When $dV_{EMF}/dQ$ appears to be smaller than the reference value the battery is in part II of its characteristic, i.e. it is "half-full". When in the course of time it appears that $dV_{EMF}/dQ$ increases and exceeds said reference value this means that, depending on whether the battery is being charged or discharged, the battery has reached part I of its characteristic (substantially full) or part III of its characteristic (nearly empty).

As the transitions between the ranges I and II and between the ranges II and III are defined comparatively accurately, the fact that such a transition is reached can be used as a check for the instantaneous value of Q, as determined by means of said bookkeeping method or as determined by means of the aforementioned method in accordance with the present invention.

It will be evident to one skilled in the art that the scope of the present invention is not limited to the examples described hereinbefore, but that various changes and modifications thereto are possible without departing from the scope of the invention as defined in the appended Claims. It will be evident to one skilled in the art that the present invention also relates to a charging device for a battery or battery pack.

It will also be obvious that any method and device as directly and explicitly manifest to one skilled in the art upon perusal of the description and examination of the drawings likewise fall within the scope of the invention.

What is claimed is:

1. A method of determining a charge condition of a battery, wherein an electromotive force is derived from measurements of a terminal voltage in a loaded condition, and the charge condition is determined with a pre-calculated relationship between the electromotive force and the charge condition on a basis of the electromotive force thus calculated, wherein the battery is loaded briefly by a controllable load so as to supply different current strengths, wherein the terminal voltages which then occur are measured, and wherein the electromotive force is calculated by extrapolation to a current strength of I=0, wherein the battery is used for powering a load, and wherein the current strength to be supplied by the battery is changed by arranging a dissipating current source or an auxiliary impedance in parallel with said load.

2. A method as claimed in claim 1, wherein the current strength is set briefly to different values during charging of the battery, wherein the terminal voltages which then occur are measured, and wherein the electromotive force is calculated by means of extrapolation to I=0.

3. A method as claimed in claim 2, wherein said extrapolation is a linear extrapolation.

4. A method as claimed in claim 1, wherein said extrapolation is a linear extrapolation.

5. A method as claimed in claim 1, wherein the charge condition of the battery thus determined is displayed on a display or the like.

6. A method as claimed in claim 1, wherein a change of the electromotive force ($dV_{EMF}$) divided by an associated change of the charge condition (dQ) is calculated; wherein the calculated value of $dV_{EMF}/dQ$ is compared with a predetermined reference value; and wherein it is decided that an instantaneous charge condition is less than completely full but more than completely empty when the calculated value of $dV_{EMF}/dQ$ is smaller than said predetermined reference value.

7. A method of determining a charge condition of a battery, wherein an electromotive force is derived from measurements of a terminal voltage in a loaded condition, and the charge condition is determined with a pre-calculated relationship between the electromotive force and the charge condition on a basis of the electromotive force thus calculated, wherein the battery is loaded for a comparatively short time so as to supply a given current strength and the terminal voltage which then occurs is measured; wherein the battery is charged with the same current strength for a comparatively short time and the terminal voltage which then occurs is measured; and wherein the electromotive force is calculated from said measurement data by averaging said two terminal voltages thus measured.

8. A battery-powered application apparatus comprising an electrical circuit and contact faces adapted to make contact with corresponding contact faces of a battery or of a battery pack that includes at least one battery; the circuit comprising:
- a control means;
- a memory which stores a relationship between an electromotive force of the battery and a charge condition of said battery;
- a current meter arranged in series with a load and having an output coupled to the control means;
- a voltage meter coupled between the contact faces of the application apparatus and having an output coupled to the control means; and
- a current source for charging the battery, which current source is controlled by the control means,
- wherein the control means is adapted to carry out a method of determining the charge condition of the battery, wherein the electromotive force is derived from measurements of a terminal voltage in a loaded condition, and the charge condition is determined with a pre-calculated relationship between the electromotive force and the charge condition on a basis of the electromotive force thus calculated.

9. An application apparatus as claimed in claim 8, further comprising a controllable load controlled by the control means and arranged in parallel with the load.

10. An application apparatus as claimed in claim 8, wherein said memory is accommodated in the battery pack, and wherein the application apparatus has coupling means connected to the control means, which coupling means are adapted to be coupled to corresponding coupling means of the battery pack upon placement of the battery pack, which corresponding coupling means are connected to said memory.

11. A battery pack for powering an application apparatus comprising contact faces adapted to make contact with corresponding contact faces of the application apparatus; said battery pack comprising:
- at least one battery;
- a control means;
- a memory which stores a relationship between an electromotive force of said at least one battery and a charge condition of said at least one battery;
- a current meter arranged in series with said at least one battery and having an output coupled to the control means;
- a voltage meter coupled between the contact faces of the battery pack and having an output coupled to the control means; and
- a load controlled by the control means and arranged in parallel with the at least one battery; wherein the control means is adapted to carry out a method of determining the charge condition of said at least one battery, wherein the electromotive force is derived from measurements of a terminal voltage in a loaded condition, and the charge condition is determined with a pre-calculated relationship between the electromotive force and the charge condition on a basis of the electromotive force thus calculated.

12. A charging device for a battery or battery pack, comprising a controllable current source and contact faces adapted to make contact with corresponding contact faces of the battery or of the battery pack; the device comprising:
- a control means for controlling the current source;
- a memory which stores a relationship between an electromotive force of the battery and a charge condition of the battery;
- a current meter arranged in series with the current source and having an output coupled to the control means;
- a voltage meter coupled between the contact faces and having an output coupled to the control means; wherein said memory is accommodated in the battery pack, and wherein the charging device has coupling means connected to the control means, wherein said coupling means are adapted to be coupled to corresponding coupling means of the battery pack upon placement of the battery pack, said corresponding coupling means being connected to said memory;
- wherein the control means is adapted to carry out a method of determining the charge condition of the battery, wherein the electromotive force is derived from measurements of a terminal voltage in a loaded condition, and the charge condition is determined with a pre-calculated relationship between the electromotive force and the charge condition on a basis of the electromotive force thus calculated.

* * * * *